US008829518B2

(12) United States Patent
Maling et al.

(10) Patent No.: US 8,829,518 B2
(45) Date of Patent: Sep. 9, 2014

(54) TEST STRUCTURE AND CALIBRATION METHOD

(75) Inventors: Jeffrey C. Maling, Grand Isle, VT (US); Anthony K. Stamper, Williston, VT (US); Eric J. White, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/231,516

(22) Filed: Sep. 13, 2011

(65) Prior Publication Data
US 2013/0062603 A1    Mar. 14, 2013

(51) Int. Cl.
*H01L 29/10* (2006.01)
(52) U.S. Cl.
USPC ..................................... 257/48; 257/E29.324
(58) Field of Classification Search
USPC .................. 438/14; 257/48, E29.324, E21.53
See application file for complete search history.

(56) References Cited

U.S. PATENT DOCUMENTS

| 5,642,196 | A | 6/1997 | Alves et al. |
| 6,204,922 | B1 | 3/2001 | Chalmers |
| 7,012,698 | B2 | 3/2006 | Patzwald et al. |
| 7,346,878 | B1 | 3/2008 | Cohen et al. |
| 2004/0126921 | A1* | 7/2004 | Volant et al. ............ 438/52 |
| 2009/0201502 | A1 | 8/2009 | Wolf et al. |

* cited by examiner

*Primary Examiner* — Tony Tran
(74) *Attorney, Agent, or Firm* — Anthony Canale; Roberts Mlotkowski Safran & Cole, P.C.

(57) ABSTRACT

A test structure for measuring a Micro-Electro-Mechanical System (MEMS) cavity height structure and calibration method. The method includes forming a sacrificial cavity material over a plurality of electrodes and forming an opening into the sacrificial cavity material. The method further includes forming a transparent or substantially transparent material in the opening to form a transparent or substantially transparent window. The method further includes tuning a thickness of the sacrificial cavity material based on measurements obtained through the transparent or substantially transparent window.

17 Claims, 4 Drawing Sheets

US 8,829,518 B2

TEST STRUCTURE AND CALIBRATION METHOD

FIELD OF THE INVENTION

The invention generally relates to semiconductor structures and, in particular, to a test structure for measuring a Micro-Electro-Mechanical System (MEMS) cavity height structure and calibration method.

BACKGROUND

Micro-Electro-Mechanical Systems (MEMS) are typically employed because of their almost ideal isolation, which is a critical requirement for wireless radio applications where they are used for mode switching of power amplifiers (PAs) and their low insertion loss (i.e., resistance) at frequencies of 10 GHz and higher. Depending on the particular application and engineering criteria, MEMS can come in many different forms. For example, MEMS switches can be realized in the form of a cantilever beam structure or a bridge beam structure.

In the cantilever structure, a cantilever arm (suspended electrode with one end fixed) is pulled toward a fixed electrode by application of an actuation voltage. The voltage required to pull the suspended electrode to the fixed electrode by electrostatic force is called pull-in voltage, which is dependent on several parameters including the length of the suspended electrode, spacing or gap (cavity) between the suspended and fixed electrodes, and spring constant of the suspended electrode, which is a function of the materials and their thickness.

MEMS can be manufactured in a number of ways using a number of different tools. In general, though, many of the methodologies, i.e., technologies, employed to manufacture MEMS have been adopted from integrated circuit (IC) technology. For example, almost all MEMS are built on wafers and are realized in thin films of materials patterned by photolithographic processes on the top of the wafer. In particular, the fabrication of MEMS uses three basic building blocks: (i) deposition of thin films of material on a substrate, (ii) applying a patterned mask on top of the films by photolithographic imaging, and (iii) etching the films selectively to the mask.

CMOS processes are known to have processing variability, which may affect the MEMS and, more particularly, cavity dimensions and placement of the beam electrode (i.e., suspended electrode). The variability of these dimensions and placement of the beam can affect the pull-in voltage. For example, in MEMS cantilever type switches, the suspended electrode is formed on a sacrificial material, which will form the cavity structure; however, due to processing variability, the cavity and hence placement of the suspended electrode may not be within design specifications for a particular pull-in voltage. This is typically due to the variability in thickness of the sacrificial cavity material deposited under the suspended electrode of the MEMS structure. More specifically, this variability may be due to silicon deposition/CMP/deposition processes. This variability can also be the result of an oxide deposition and CMP variability, which also adds to the sacrificial cavity material (e.g., silicon) thickness variability component.

Accordingly, there exists a need in the art to overcome the deficiencies and limitations described hereinabove.

SUMMARY

In a first aspect of the invention, a method comprises forming a sacrificial cavity material over a plurality of electrodes and forming an opening into the sacrificial cavity material. The method further comprises forming a transparent or substantially transparent material in the opening to form a transparent or substantially transparent window. The method further comprises tuning a thickness of the sacrificial cavity material based on measurements obtained through the transparent or substantially transparent window.

In an another aspect of the invention, a method of forming a test structure and a MEMS structure comprises forming a plurality of electrodes on a substrate and forming a sacrificial material on the substrate and over the plurality of electrodes. The method further comprises planarizing the sacrificial material and adding additional sacrificial material over the sacrificial material. The method further comprises patterning the additional sacrificial material and the sacrificial material to form an opening within a MEMS cavity structure. The method further comprises forming a transparent or substantially transparent material over and adjacent the MEMS cavity structure and within the opening. The method further comprises patterning the transparent or substantially transparent material over the MEMS cavity structure. The method further comprises planarizing the MEMS cavity structure and remaining portions of the transparent or substantially transparent material on the MEMS cavity structure and adjacent thereto. The method further comprises tuning a thickness of the MEMS cavity structure based on a measurement taken of the transparent or substantially transparent material through the opening.

In yet another aspect of the invention, a structure comprises a test structure and a MEMS structure on a wafer. The test structure comprises: a sacrificial cavity material over a plurality of electrodes; an opening into the sacrificial cavity material; and a transparent or substantially transparent material in the opening, forming a transparent or substantially transparent window.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a MEMS cavity height calibration structure, which comprises the structures of the present invention. In still further embodiments, a method in a computer-aided design system is provided for generating a functional design model of the MEMS cavity height calibration structure. The method comprises generating a functional representation of the structural elements of the MEMS cavity height calibration structure.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention generally relates to semiconductor structures and, in particular, to a test structure for measuring a micro-electro-mechanical system (MEMS) cavity height structure and calibration method. Advantageously, the test structure provides a MEMS cavity structure to accurately measure the thickness of sacrificial cavity material prior to forming an electrode beam of a MEMS device. For example, the precise measurement is accomplished by opening a window in sacrificial cavity material (a MEMS cavity height structure) and depositing therein a transparent or substantially transparent material, during a patterning of a MEMS device on the same wafer. This material can be, for example, oxide. A measuring device can then measure the thickness of the oxide material within the window, which is comparable to the thickness of the sacrificial material (that forms the cavity of the MEMS structure). Also, due to the small size of the window, minimal if any dishing of the oxide material occurs within the window, thus ensuring an accurate measurement. This is compared to oxide material that is provided on the sides of the sacrificial material, which exhibit dishing that affects accurate measurements.

FIGS. 1-8 show fabrication processes and respective structures in accordance with aspects of the invention. More specifically, FIGS. 1-8 show the fabrication processes of a test structure for measuring a micro-electro-mechanical system (MEMS); whereas, FIGS. 7 and 8 additionally represent fabrication processes for one or more MEMS that are used in a device. The test structure and additional MEMS can be formed on the same wafer, as described below.

Figure 1:
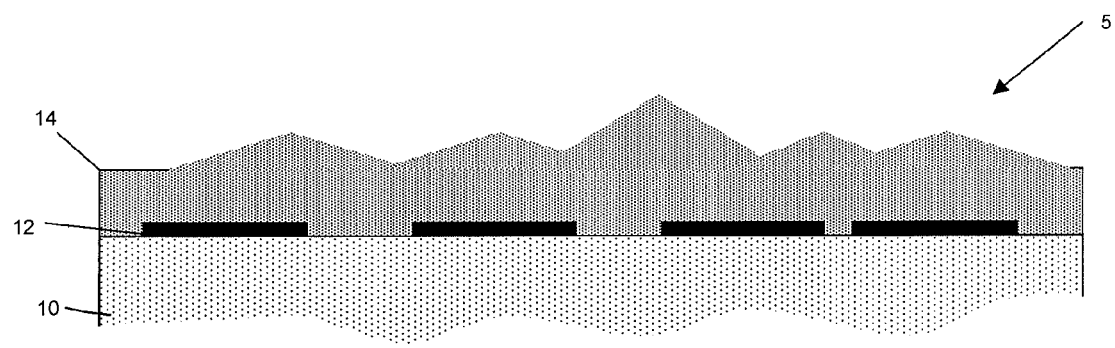
FIGS. 1-8 show fabrication processes and respective structures in accordance with aspects of the invention.

FIG. 1 shows a structure and respective processing steps applicable to both the test structure and the MEMS. More specifically, the structure 5 of FIG. 1 includes a substrate 10. The substrate 10 can be, for example, any insulator material, BULK or SOI (silicon on insulator). In the SOI implementation, the substrate 10 includes a wafer or substrate, an insulator layer, also referred to as BOX, and a semiconductor layer. The semiconductor layer can be an active silicon material, for example.

A wiring layer is formed on the substrate 10 to form multiple wires 12, using conventional deposition and patterning processes. For example, the wiring layer can be deposited on the substrate 10 to a depth of about 0.05 to 4 microns; although other dimensions are also contemplated by the present invention. Thereafter, the wiring layer is patterned to form the wires (lower electrodes) 12, using lithography and etching processes known in the art. Although not shown, at least one of the wires 12 is in contact (direct electrical contact) with an interconnect.

In embodiments, the wires 12 can be formed from aluminum or an aluminum alloy such as AlCu, AlSi, or AlCuSi; although other wiring materials are also contemplated by the present invention. For example, the wires 12 can be a refractory metal such as Ti, TiN, TiN, Ta, TaN, and W, or AlCu, amongst other wiring materials. In embodiments, the wires 12 can be doped with Si, e.g., 1%, to prevent the metal, e.g., Al, from reacting with a sacrificial cavity material, e.g., silicon. In embodiments, the aluminum portion of the wire 12 can be doped with Cu, e.g. 0.5%, to increase the electromigration resistance of the wire 12. The wire material could be the same for both the test structure and the additional MEMS.

A layer of sacrificial cavity material 14 is deposited on the substrate 10 (and covering the wires 12). The sacrificial cavity material 14 can be any material which can subsequently be selectively removed using, for example $XeF_2$ gas, to form a MEMS cavity. In embodiments, silicon, tungsten, tantalum or germanium can be used for the sacrificial cavity material 14. The sacrificial cavity material 14 can be deposited using any conventional plasma vapor deposition (PVD), PECVD, rapid thermal CVD (RTCVD), or low pressure plasma vapor deposition (LPCVD) which operates at temperatures compatible with the wires 12, e.g., <420° C. In embodiments, the sacrificial cavity material 14 is deposited to a height of about 0.1 to 10 microns. As shown in FIG. 1, the sacrificial cavity material 14 has a rough surface due to the deposition process.

Figure 2:
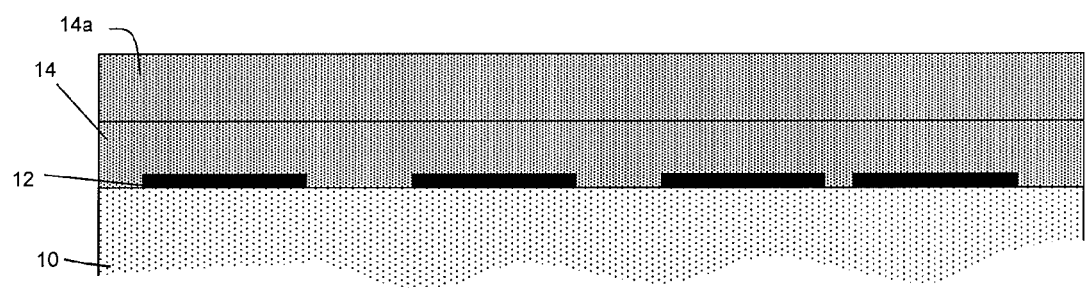

FIG. 2 shows a structure and processing steps applicable to both the test structure and the additional MEMS. More specifically, in FIG. 2, the surface of the sacrificial cavity material 14 is planarized using conventional processes such as chemical mechanical polishing (CMP). Another layer of sacrificial material 14a is then deposited on the sacrificial cavity material 14 to increase the height of the structure, i.e., adjust the height of a subsequently formed cavity for a MEMS beam. This sacrificial cavity material 14a can be deposited using any conventional PVD, PECVD, RTCVD, or LPCVD which operates at temperatures compatible with the wires 12, e.g., <420° C.

Figure 3:
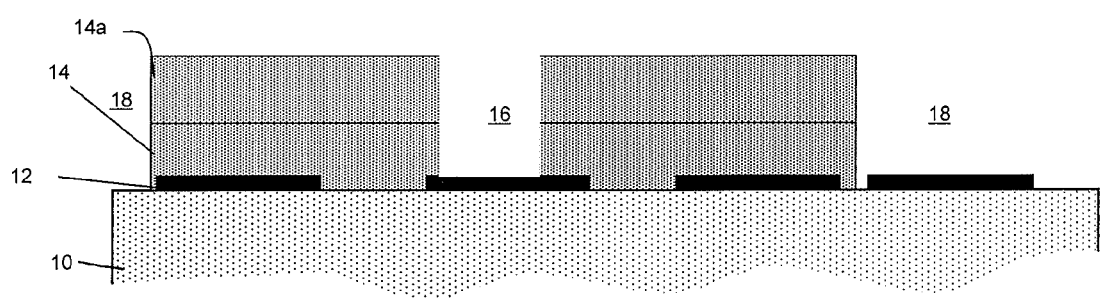

FIG. 3 shows a structure and processing steps applicable to the test structure. More specifically, in FIG. 3, the layers 14, 14a are patterned to form an opening 16 and patterns 18, where the opening 16 is formed in the layers 14, 14a and is aligned with one of the wires 12. The opening 16 is about 20 to 50 microns in diameter; although other small dimensions which prevent dishing of material placed therein are contemplated by the present invention. The patterns 18 result in a sacrificial material that is the shape of a cavity that will be formed in subsequent processes, i.e., MEMS cavity structure.

In embodiments, the layers 14, 14a can be patterned using conventional lithography and etching methods. For example, a resist is deposited on the sacrificial cavity material 14a and exposed to light (energy) to form a pattern. The pattern is then transferred to the layers 14a, 14 by conventional etching processes such as reactive ion etching (RIE), to form the opening 16 and patterns 18. The resist can then be removed using a conventional ashing process, as an example. It should be understood that only the test structure on the wafer will undergo the above processes for fabricating the opening 16; whereas, the additional MEMS will undergo the fabrication process to form the patterns 18, i.e., MEMS cavity structure.

Figure 4:
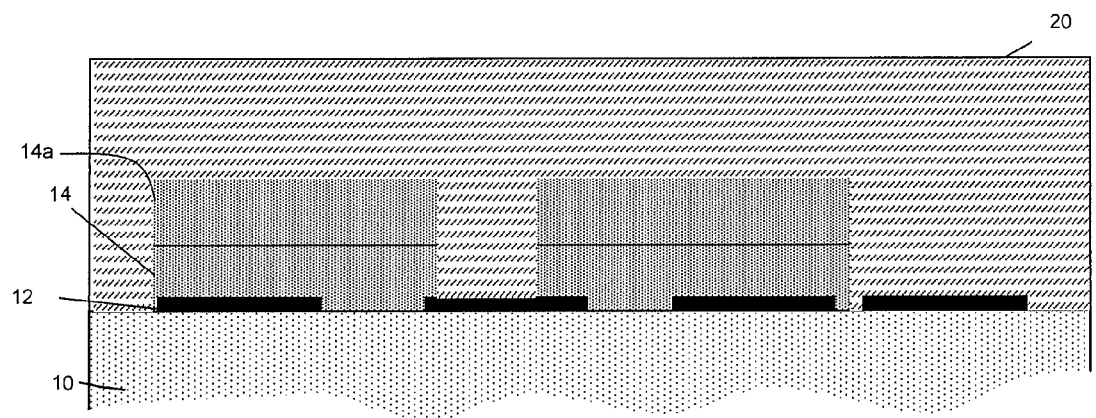

In FIG. 4, an insulator material 20 is deposited within the opening 16 and patterns 18, as well as on the sacrificial cavity material 14a. The insulator material 20 is any transparent or substantially transparent material such as oxide. The insulator material 20 can be deposited using any conventional deposition process such as a CVD. For the additional MEMS, the insulator material will be formed on the sacrificial cavity material 14a and within the patterns 18.

Figure 5:
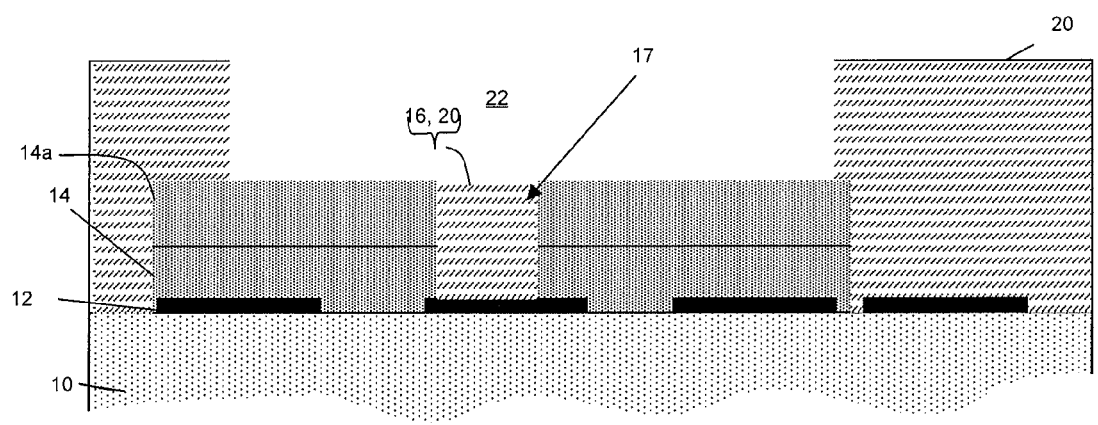

In FIG. 5, the insulator material 20 is patterned using conventional lithography and etching processes. In embodiments, the patterning results in an opening 22 over the sacrificial cavity material 14a, exposing the opening 16 that is filled with the insulator material 20. The patterning process will expose the insulator material 20 in the opening 16 forming, e.g., a transparent or substantially transparent window 17. The transparent window 17 is about 20 to 50 microns in diameter or other diameter that would not result in any significant dishing of the transparent or substantially transparent material. This is compared to the insulator material 20 within the patterns 18, in which dishing occurs due to the patterns larger dimensions.

The etching process removes much of the insulator material 20 on the sacrificial cavity material 14a, which will facilitate subsequent polishing processes. The patterning process of FIG. 5 is applicable to both the test structure and the additional MEMS (with the exception of exposing the window 17 for the additional micro-electro-mechanical structures).

Figure 6:
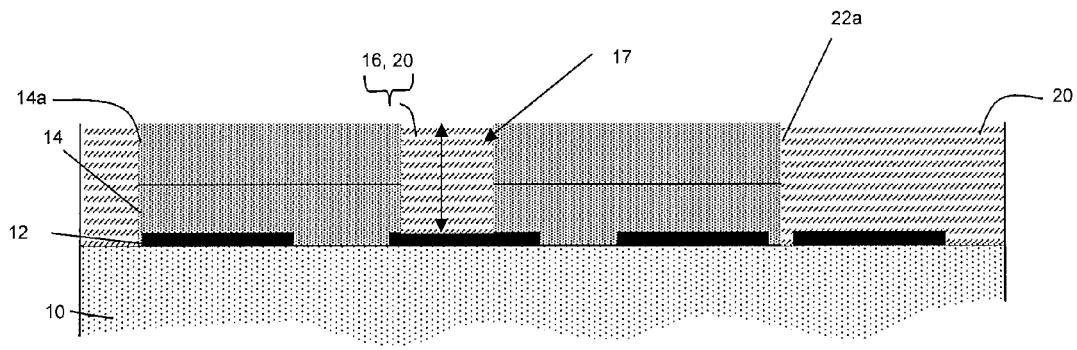

In FIG. 6, the insulator material 20 and upper surface of layer 14a undergo a conventional CMP process. After the CMP process, the thickness of the layers 14, 14a can be accurately measured through the window 17 with, for example, a Tencor F5 Film Measurement System known to those of skill in the art. More specifically, as the opening 16 (window 17) is aligned with one of the wires 14, the measurement will be equivalent to a thickness of the sacrificial cavity material from a top surface thereof to a surface of the aligned wire 14. Also, as the material 20 within the window 17 does not significantly dish, due to the dimensions of the opening 16, it is possible to obtain a very accurate measurement. This is compared to dishing that occurs in the patterns 18, which prevents accurate measurement of the thickness of the layers 14, 14a. It should also be understood by those of skill in the art that dishing of the insulator material 20 becomes more prominent (i.e., increases) as measured farther away from an edge 22 of the MEMS cavity structure.

By measuring the thickness of the layers 14, 14a (MEMS cavity structure), it is now possible to tailor the CMP polish and, if required, any subsequent deposition of material, to achieve a desired thickness of the MEMS cavity structure (14, 14a) to meet design specifications, e.g., to achieve a certain cavity height and placement of a MEMS beam for a required MEMS pull-in voltage. That is, based on the measured thickness, it is now possible to adjust the CMP polish and/or deposition of additional sacrificial cavity material to adjust the thickness of the MEMS cavity structure, prior to formation of the MEMS beam. The MEMS cavity structure variability can be fine tuned (calibrated) and controlled to within acceptable material thickness, e.g., less than +/−0.12 μm (less than +/−6%). In this way, by adjusting the thickness of the sacrificial material, the volume of the MEMS cavity can be accurately matched to the designed MEMS pull-in voltage. The tailoring process, i.e., CMP polish and/or deposition of additional sacrificial cavity material, is also provided for the MEMS, as it is on the same wafer as the test structure.

Figure 7:
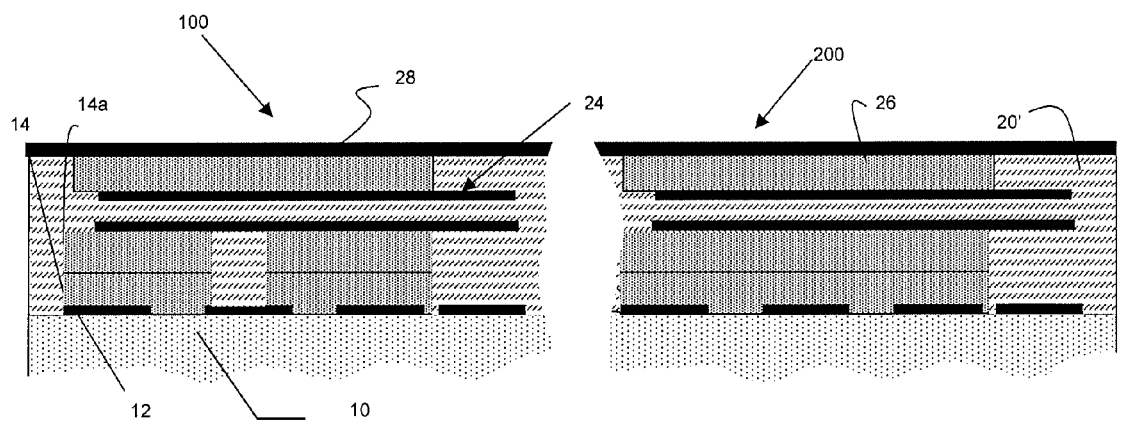
Figure 8:
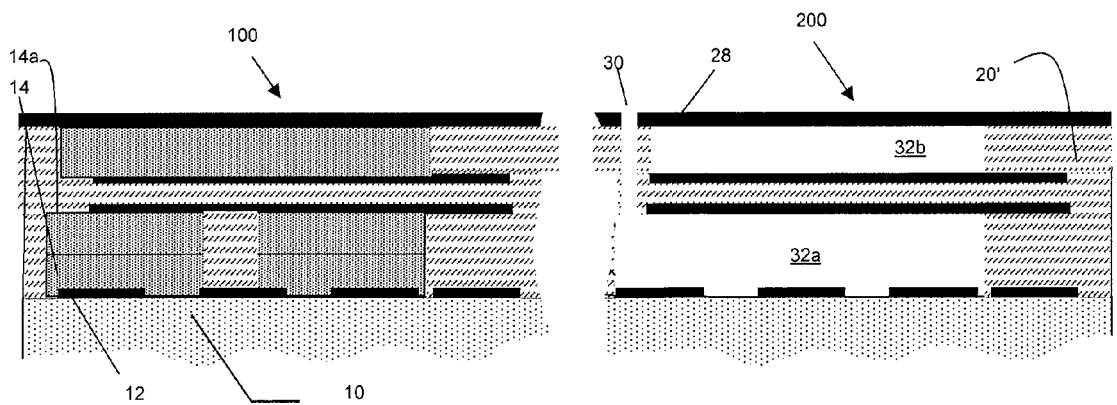

FIGS. 7 and 8 show additional processes for forming a MEMS beam on both the test structure and the additional MEMS. In FIGS. 7 and 8, the test structure is represented by reference numeral 100 and the MEMS is represented by reference numeral 200. In the processes of FIG. 7, a MEMS beam 24 is fabricated on the sacrificial cavity material 14a and portions of the insulator material 20. The MEMS beam 24 is fabricated using conventional deposition, lithography and etching processes. For example, the MEMS beam 24 is formed by depositing an insulator material between a bottom metal layer and a top metal layer, and then patterning the layers to form the MEMS beam 24. The insulator may also be an oxide material, which is transparent or substantially transparent. The oxide of the MEMS beam 24 can be measured, much like the cavity material. After measurement, the thickness of the MEMS beam 24 can be tailored (tuned) by planarizing the oxide material and/or adding additional oxide material, prior to the formation of the top metal layer.

After formation of the MEMS beam 24, another insulator layer 20' is formed over the MEMS beam 24, which is then patterned using conventional CMOS processes to form an opening. Another sacrificial material 26 is deposited on the MEMS beam 24 and within the opening, with a lid 28 formed on the sacrificial material 26 and any portions of the insulator layer 20'.

In FIG. 8, a vent hole 30 is formed in the lid 28 to expose the sacrificial material 26. The sacrificial material 14, 14a and 26 can then be vented to form the cavities 32a and 32b. More specifically, the vent hole 30 can be formed using conventional lithographic and etching processes known to those of skill in the art. The width and height of the vent hole 30 determines the amount of material that should be deposited after venting to pinch off the vent hole 30. The vent hole 30 may be any designed shape, e.g., circular or nearly circular to minimize the amount of subsequent material needed to pinch it off, or shaped in an octagon or other shape. The vent hole may also be provided in different locations, including through the beam. Prior to venting, any unwanted oxide formed by exposing the sacrificial material to air can be cleaned using, for example, an HF acid. The stripping (e.g., etching) of the sacrificial material 14, 14a and 26 can be performed using a $XeF_2$ etchant through the vent hole 30. The etching will strip all of the sacrificial material (silicon), forming a lower cavity or chamber 32a and an upper cavity or chamber 32b. In embodiments, the same process do not have to be performed on the test structure, as this structure will not be used in any device. The vent hole can then be plugged to form a hermetic seal.

Figure 9:
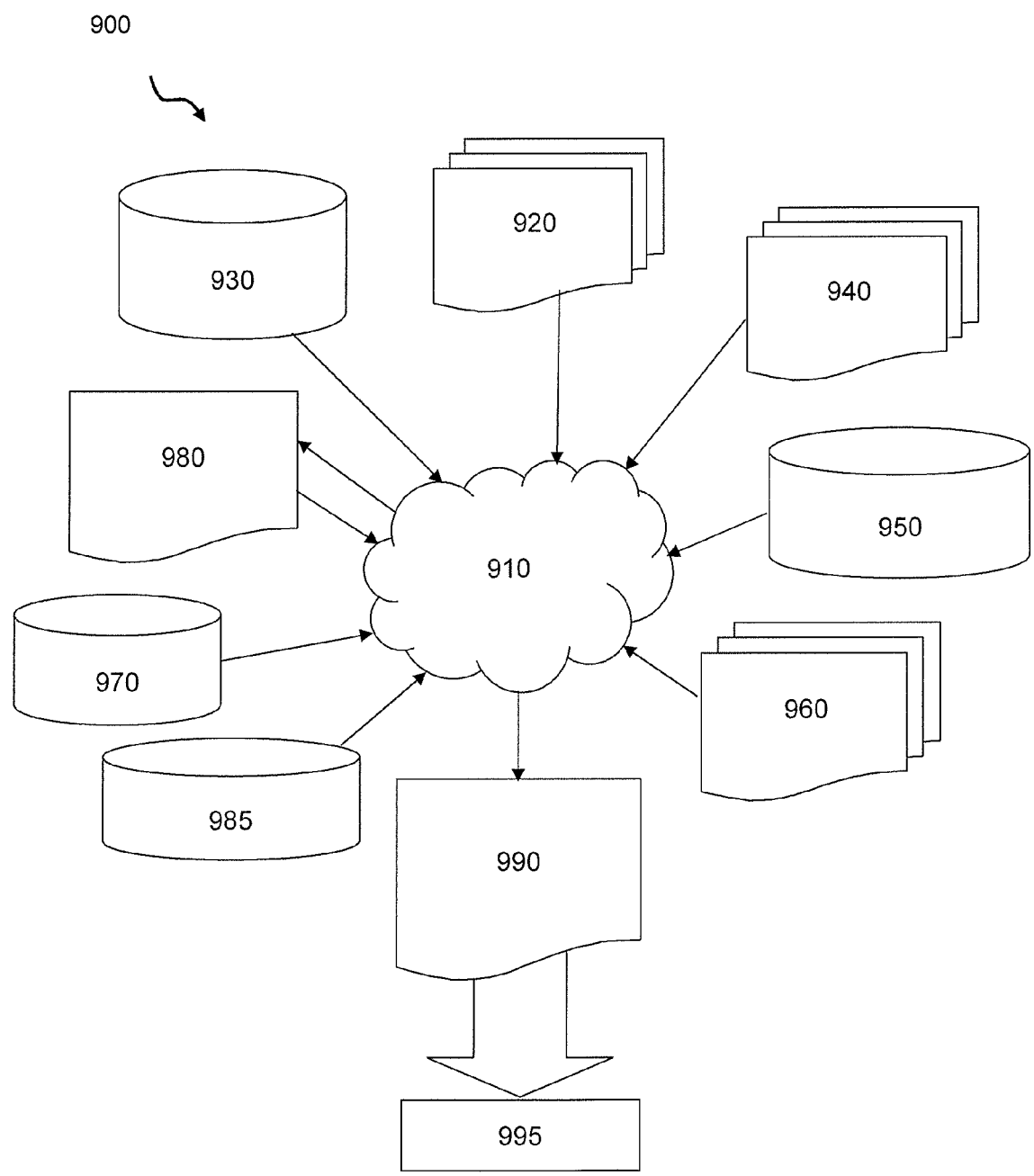
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 990 may comprise a compiled, executable HDL simulation model that functionally simulates the devices shown in FIGS. 1-8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Many modifications and variations will be apparent to those of ordinary skill in the art without departing from the scope and spirit of the invention. The corresponding structures, materials, acts, and equivalents of all means or step plus function elements in the claims, if applicable, are intended to include any structure, material, or act for performing the function in combination with other claimed elements as specifically claimed. Accordingly, while the invention has been described in terms of embodiments, those of skill in the art will recognize that the invention can be practiced with modifications and in the spirit and scope of the appended claims.

What is claimed is:

1. A method comprising:
    forming a first sacrificial cavity material over a plurality of electrodes;
    planarizing the first sacrificial cavity material;
    forming a second sacrificial cavity material on the planarized first sacrificial cavity material;
    patterning the first and second sacrificial cavity materials to form an opening aligned with an underlying electrode of the plurality of electrodes;
    forming a transparent or substantially transparent material over the first and second sacrificial cavity materials including within the opening and over the underlying electrode;
    patterning the transparent or substantially transparent material to form a transparent or substantially transparent window within the first and second sacrificial cavity materials;
    polishing an upper surface of the second sacrificial cavity material and remaining portions of the transparent or substantially transparent material formed in additional patterned areas of the first and second sacrificial cavity materials;
    prior to form a Micro-Electro-Mechanical System (MEMS) beam, measuring a thickness of the first and second sacrificial cavity materials from a top surface to the underlying electrode through the opening in the first and second sacrificial cavity materials and which is obtained through the transparent or substantially transparent window; and
    tuning the thickness of the first and second sacrificial cavity materials after the measuring, the tuning includes depositing additional sacrificial cavity material on the second sacrificial cavity material.

2. The method of claim 1, wherein the forming the transparent or substantially transparent material comprises depositing an oxide material within the opening.

3. The method of claim 1, wherein the opening is sized to avoid dishing of the transparent or substantially transparent material.

4. The method of claim 3, wherein the opening is about 20 to 50 microns in diameter.

5. The method of claim 1, wherein forming the first sacrificial cavity material comprises depositing silicon.

6. The method of claim 1, wherein the opening is aligned with one of the electrodes, and the measurement is a thickness of the first and second sacrificial cavity materials from a top surface to the one of the electrodes.

7. A method comprising:
    forming a first sacrificial cavity material over a plurality of electrodes;
    planarizing the first sacrificial cavity material;
    forming a second sacrificial cavity material on the planarized first sacrificial cavity material;
    patterning the first and second sacrificial cavity materials to form an opening aligned with an underlying electrode of the plurality of electrodes;
    forming a transparent or substantially transparent material over the first and second sacrificial cavity materials including within the opening and over the underlying electrode;
    patterning the transparent or substantially transparent material to form a transparent or substantially transparent window within the first and second sacrificial cavity materials;
    polishing an upper surface of the second sacrificial cavity material and remaining portions of the transparent or substantially transparent material formed in additional patterned areas of the first and second sacrificial cavity materials;
    prior to form a Micro-Electro-Mechanical System (MEMS) beam, measuring a thickness of the first and second sacrificial cavity materials from a top surface to the underlying electrode through the opening in the first and second sacrificial cavity materials and which is obtained through the transparent or substantially transparent window; and
    tuning the thickness of the first and second sacrificial cavity materials after the measuring, the tuning includes planarizing the second sacrificial cavity material.

8. The method of claim 1, further comprising tuning the thickness of the second sacrificial cavity material after the measuring which occurs in the MEMS structure and a test structure on a same wafer.

9. The method of claim 8, wherein tuning the thickness in the MEMS structure and the test structure occurs at a same time through one of a polishing process and deposition of additional sacrificial cavity material.

10. The method of claim 8, further comprising forming a MEMS beam on the tuned sacrificial cavity material of the MEMS structure, wherein:
    the MEMS beam is tuned by measuring a transparent or substantially transparent insulator material between an upper and lower electrode; and
    planarizing the transparent or substantially transparent insulator material or depositing additional transparent or substantially transparent insulator material based on the measurement.

11. A method of forming a test structure and a Micro-Electro-Mechanical System (MEMS) structure, comprising the following steps in sequence:
    forming a plurality of electrodes on a substrate;
    forming a sacrificial material on the substrate and over the plurality of electrodes;
    planarizing the sacrificial material;
    adding additional sacrificial material over the sacrificial material;
    patterning the additional sacrificial material and the sacrificial material to form a MEMS cavity structure and an opening aligned with a single electrode of the plurality of electrodes;
    forming a transparent or substantially transparent material over and adjacent the MEMS cavity structure and within the opening, contacting the single electrode of the plurality of electrodes;
    patterning the transparent or substantially transparent material over the MEMS cavity structure, leaving the transparent or substantially transparent material within the opening;
    planarizing the MEMS cavity structure and remaining portions of the transparent or substantially transparent material on the MEMS cavity structure and adjacent thereto;
    measuring a thickness of the sacrificial material and the additional sacrificial material through the transparent or substantially transparent material within the opening, from a top of the additional sacrificial material to the single electrode of the plurality of electrodes;

tuning a thickness of the MEMS cavity structure based on a measurement taken of the transparent or substantially transparent material through the opening; and forming a MEMS beam on the tuned MEMS cavity structure and tuning the MEMS beam by first measuring an insulator material of the MEMS beam and then adjusting its thickness.

12. The method of claim 11, wherein forming the transparent or substantially transparent material comprises depositing an oxide material within the opening.

13. The method of claim 12, wherein the opening is sized to avoid dishing of the oxide material.

14. The method of claim 11, wherein tuning the thickness comprises planarizing the MEMS cavity structure.

15. The method of claim 11, wherein tuning the thickness includes depositing additional sacrificial cavity material on the MEMS cavity structure.

16. The method of claim 11, wherein tuning the thickness occurs in the MEMS structure and the test structure on a same wafer.

17. The method of claim 11, wherein the opening is aligned with one of the electrodes, and the measurement is a thickness of the MEMS cavity structure from a top surface to the one of the electrodes.

* * * * *